US012699333B2

(12) United States Patent
Sang et al.

(10) Patent No.: US 12,699,333 B2
(45) Date of Patent: Aug. 4, 2026

(54) MASK PLATE, ALIGNMENT MARK AND PHOTOLITHOGRAPHY SYSTEM

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Wei Hua Sang, Shanghai (CN); Shi Jie Wu, Shanghai (CN); Bin Xing, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 361 days.

(21) Appl. No.: 18/368,094

(22) Filed: Sep. 14, 2023

(65) Prior Publication Data

US 2024/0004320 A1 Jan. 4, 2024

Related U.S. Application Data

(63) Continuation of application No. PCT/CN2021/081169, filed on Mar. 16, 2021.

(51) Int. Cl.
*G03F 9/00* (2006.01)

(52) U.S. Cl.
CPC ............ *G03F 9/708* (2013.01); *G03F 9/7076* (2013.01)

(58) Field of Classification Search
CPC ... G03F 1/42; G03F 7/20; G03F 9/708; G03F 9/7076; G93B 27/32
(Continued)

(56) References Cited

U.S. PATENT DOCUMENTS

2009/0195768 A1* 8/2009 Bijnen ................... G03B 27/32
355/77

FOREIGN PATENT DOCUMENTS

CN 101140422 3/2008
CN 101251724 8/2008
(Continued)

OTHER PUBLICATIONS

International Search Report issued Dec. 14, 2021 in International (PCT) Application No. PCT/CN2021/081169.

*Primary Examiner* — Fazli Erdem
(74) *Attorney, Agent, or Firm* — Crowell & Moring LLP

(57) ABSTRACT

A mask plate, an alignment mark and a photolithography system are provided. In one form, an alignment mark includes a plurality of alignment patterns arranged at intervals, where the alignment pattern includes a first pattern extending in a first direction and a second pattern extending in a second direction, the first pattern includes a first end and a second end which are opposite to each other in the first direction, the second pattern includes a third end and a fourth end which are opposite to each other in the second direction, the second end is connected to the third end, the fourth end is connected to the first end, and the alignment pattern is a two-dimensional linear pattern.

10 Claims, 4 Drawing Sheets

(58) Field of Classification Search
    USPC ........................................................ 438/401
    See application file for complete search history.

(56) References Cited

FOREIGN PATENT DOCUMENTS

| CN | 110534501 | 12/2019 |
| CN | 111381460 | 7/2020 |

\* cited by examiner

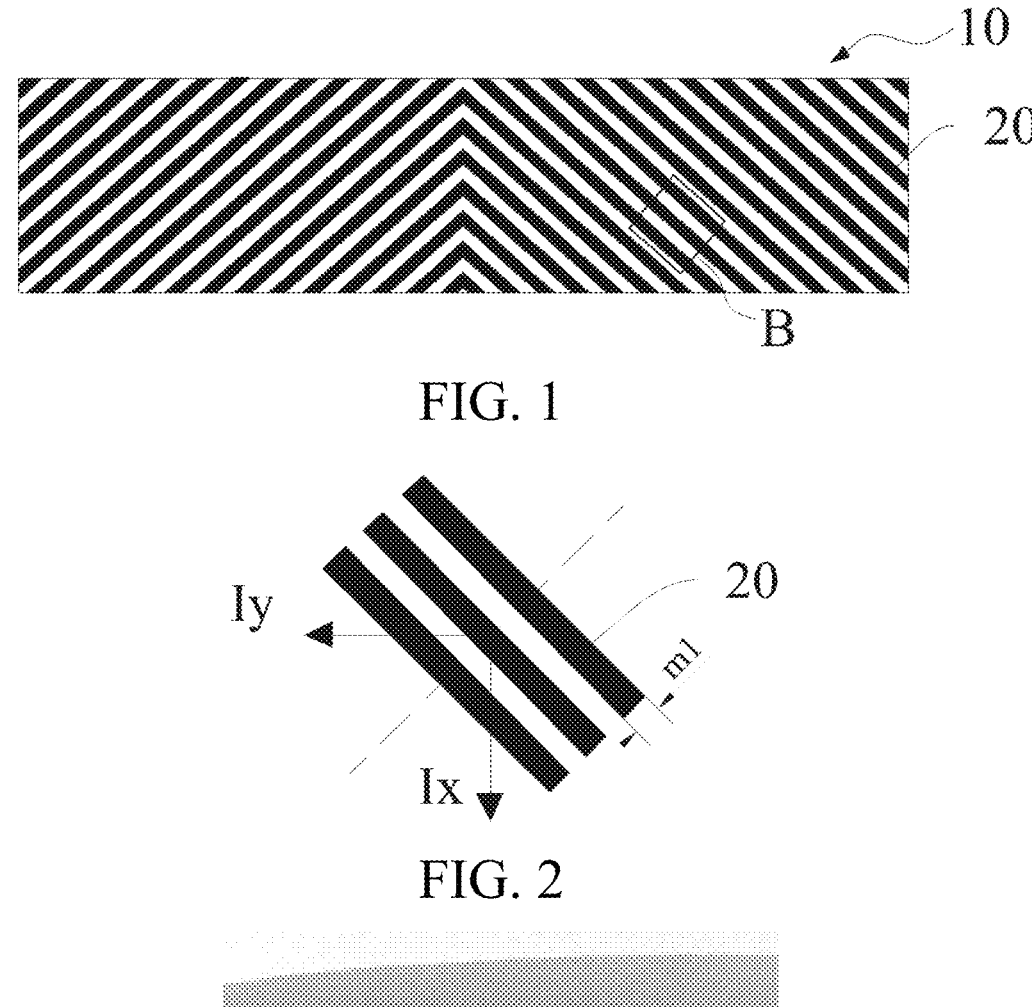
FIG. 1
FIG. 2
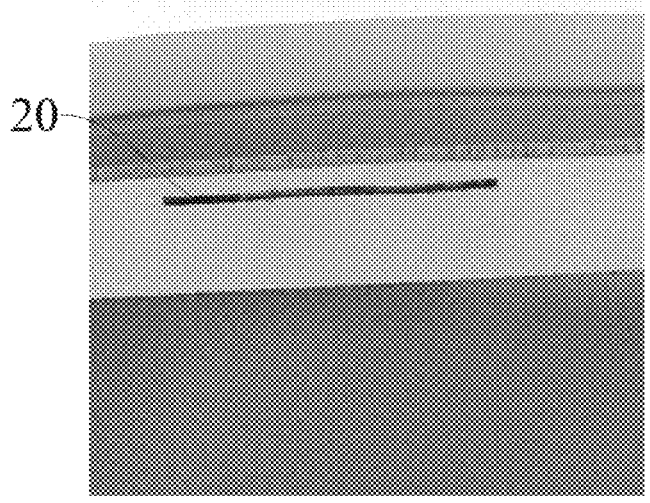
FIG. 3

200

MASK PLATE, ALIGNMENT MARK AND PHOTOLITHOGRAPHY SYSTEM

RELATED APPLICATIONS

The present application is a continuation application of PCT Patent Application No. PCT/CN2021/081169, filed on Mar. 16, 2021, the entire content of which is incorporated herein by reference.

TECHNICAL FIELD

Embodiments and implementations of the present disclosure relate to the field of semiconductor manufacturing, and in particular to a mask plate, an alignment mark, and a photolithography system.

BACKGROUND

With the development of integrated circuit technology, a feature size to be realized on a wafer is becoming smaller and smaller. Therefore, the requirements of the photolithography technology on the accuracy of photolithography processes and photolithography systems have also become higher and higher.

A complete chip manufacturing process generally needs to undergo multiple photolithography processes. The photolithography process is a process for forming a mask in semiconductor production. The photolithography relates to basic steps such as workpiece loading, alignment of the region to be processed of a workpiece and a mask plate, workpiece exposure and workpiece unloading, and particularly relates to the accurate alignment of the region to be processed of the workpiece with the mask plate when a workpiece pattern needs to be subjected to multi-layer exposure, which is the premise to ensure the correct processing of the workpiece when the line width is continuously reduced. In order to ensure that the pattern overlay offset between different layers is within the specification, an alignment mark will be formed in an anterior layer for alignment of a later layer in a photolithography process. After the alignment is completed, the pattern is accurately projected on the region to be processed of the workpiece, or when a new layer of pattern is accurately overlaid and projected on the region to be processed of the workpiece on which the pattern is formed previously, the accurate transfer of the pattern from the mask plate to a substrate can be realized by exposing the current layer.

Before the current layer is exposed, it is usually necessary to perform chemical mechanical polishing (CMP) on the surface of the wafer to increase the flatness of the surface of the wafer, which is beneficial to the transfer of the pattern. At present, the alignment technology in a high-end photolithography machine uses a smart alignment sensor hybrid (SMASH) system which still has the problem of poor OVL accuracy in an actual photoithography process.

Technical Problem

The problem addressed by embodiments and implementations of the present disclosure is to provide a mask plate, an alignment mark, and a photolithography system to increase the overlay (OVL) accuracy.

Technical Solution

To address the above problem, some forms of the present disclosure provide a mask plate, including: a device mask pattern for forming a device pattern and an alignment mask pattern for forming an alignment mark, where the alignment mask pattern includes two-dimensional linear patterns.

In some implementations, the alignment mask pattern includes: a plurality of combined patterns arranged at intervals, where the combined pattern includes a first mask sub-pattern extending in a first direction and a second mask sub-pattern extending in a second direction, the first mask sub-pattern and the second mask sub-pattern are alternately connected in sequence, the first mask sub-pattern includes a first end and a second end which are opposite to each other in the first direction, the second mask sub-pattern includes a third end and a fourth end which are opposite to each other in the second direction, the second end is connected to the third end, and the fourth end is connected to the first end.

In some implementations, the first direction is perpendicular to the second direction.

In some implementations, the size of the first mask sub-pattern in the second direction is the same as the size of the second mask sub-pattern in the first direction.

In some implementations, the size of the first mask sub-pattern in the first direction is the same as the size of the second mask sub-pattern in the second direction.

In some implementations, the interval between the second mask sub-patterns in the first direction is equal to the interval between the first mask sub-patterns in the second direction.

Some implementations of the present disclosure provides an alignment mark, including: a plurality of alignment patterns arranged at intervals, where the alignment pattern includes a first pattern extending in a first direction and a second pattern extending in a second direction, the first pattern and the second pattern are alternately connected in sequence, the first pattern includes a first end and a second end which are opposite to each other in the first direction, the second pattern includes a third end and a fourth end which are opposite to each other in the second direction, the second end is connected to the third end, and the fourth end is connected to the first end.

In some implementations, the first direction is perpendicular to the second direction.

In some implementations, the size of the first pattern in the second direction is the same as the size of the second pattern in the first direction.

In some implementations, the size of the first pattern in the second direction is 50 nm to 300 nm.

In some implementations, the size of the first pattern in the first direction is the same as the size of the second pattern in the second direction.

In some implementations, the interval between the second patterns in the first direction is equal to the interval between the first patterns in the second direction.

Correspondingly, some implementations of the present disclosure further provides a photolithography system which uses the above mask plate to form an alignment mark.

Beneficial Effects

Compared with the prior art, technical solutions in embodiments and implementations of the present disclosure have at least the following advantages: the mask plate provided in the embodiments of the present disclosure includes: a device mask pattern for forming a device pattern and an alignment mask pattern for forming an alignment mark, where the alignment mask pattern includes two-dimensional linear patterns. In implementations of the present disclosure, the alignment mask pattern includes two-dimensional linear patterns, and the alignment mark formed by the alignment mask pattern of the mask plate provided in implementations of the present disclosure subsequently is also a two-dimensional linear pattern. Compared with the case in which the alignment mark is a one-dimensional linear pattern, in the process of alignment using the alignment mark provided in implementations of the present disclosure, the alignment mark forms periodically arranged Moire patterns on the macro level, the Moire patterns can enable an alignment system to obtain greater first-order diffracted signal intensity, and correspondingly, the alignment signal intensity is larger, so that the OVL accuracy is increased, and the rework rate and production cost are reduced.

The alignment mark provided in implementations of the present disclosure includes a plurality of alignment patterns arranged at intervals, where the alignment pattern includes a first pattern extending in a first direction and a second pattern extending in a second direction, the first pattern includes a first end and a second end which are opposite to each other in the first direction, the second pattern includes a third end and a fourth end which are opposite to each other in the second direction, the second end is connected to the third end, the fourth end is connected to the first end, and the alignment pattern is a two-dimensional linear pattern. Compared with the case in which the alignment mark is a one-dimensional linear pattern, in the process of alignment using the alignment mark provided in the embodiments of the present disclosure, the alignment mark forms periodically arranged Moire patterns on the macro level, the Moire patterns can enable an alignment system to obtain greater first-order diffracted signal intensity, and correspondingly, the alignment signal intensity is larger, so that the OVL accuracy is increased, and the rework rate and production cost are reduced.

In some implementations, the size of the first pattern in the second direction is the same as the size of the second pattern in the first direction, and the size of the first pattern in the second direction is 50 nm to 300 nm. Compared with the case in which the size of the first pattern in the second direction is a micron level and the size of the second pattern in the first direction is a micron level, the width of the first pattern and the width of the second pattern are smaller. Correspondingly, in the process of performing CMP on a wafer, the area of chemical reaction between an alignment pattern and a polishing solution is smaller, so that the thickness of the alignment pattern (the size of the alignment pattern in a normal direction of the surface of the wafer) is not easy to reduce. In the photolithography process, the magnitude of the alignment signal intensity is directly proportional to the thickness of the alignment pattern, as a result, if the thickness of the alignment pattern is larger, correspondingly, the alignment signal intensity generated by the alignment mark is larger, so that the OVL accuracy is higher, and the rework rate and production cost are reduced.

BRIEF DESCRIPTION OF THE DRAWINGS

FIG. 1 is a schematic structural diagram of an alignment mark in smart alignment sensor hybrid (SMASH) alignment system.

FIG. 2 is a partially enlarged view of a part B in FIG. 1.

FIG. 3 is an electron microscope cross-sectional view of a semiconductor structure obtained based on the alignment mark in FIG. 1.

DETAILED DESCRIPTION

Figure 4:
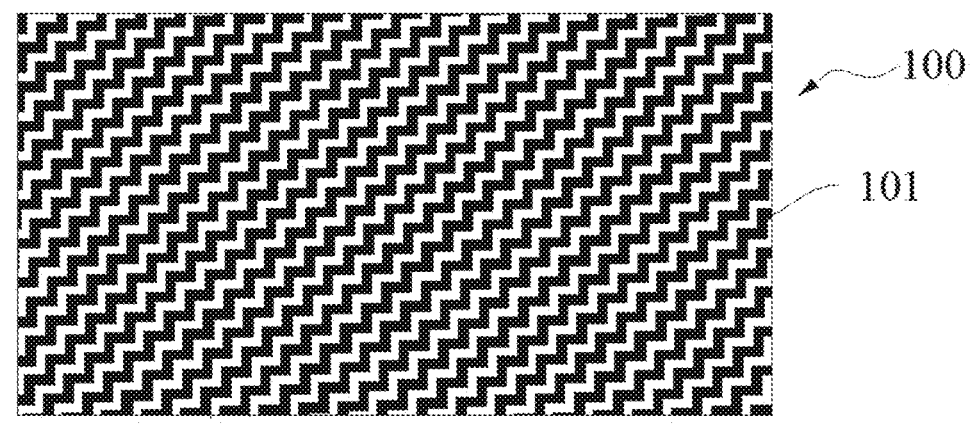
FIG. 4 is a schematic structural diagram of an alignment mask pattern on a mask plate.

As discussed in the Background, it can be seen that there is still a problem of poor OVL accuracy in the actual photolithography process. The reasons for poor stability of the alignment mark in photolithography are analyzed with reference to FIG. 1 to FIG. 3.

FIG. 1 is a schematic structural diagram of an alignment mark 10 in a smart alignment sensor hybrid (SMASH) alignment system. FIG. 2 is a partially enlarged view of a part B in FIG. 1. The alignment mark 10 includes a plurality of alignment patterns 20 arranged periodically, and the alignment pattern 20 is a one-dimensional linear pattern. In the extension direction perpendicular to the alignment pattern 20, the line width ml of the alignment pattern 20 is 1.13 μm, and the interval between the alignment patterns 20 is the same as the line width of the alignment pattern 20, both of which are 1.13 μm.

As shown in FIG. 2, in the photolithography process, the diffracted light of an oblique 45° one-dimensional linear pattern can be decomposed into a first direction (Iy) and a second direction (Ix). The signal intensity according to the first direction can be used for positioning in the first direction in the alignment process, and the signal intensity according to the second direction can be used for positioning in the second direction in the alignment process.

In the photolithography process, the pattern density of the one-dimensional linear pattern is smaller. In the alignment process of a photolithography machine according to the alignment mark 10 at the anterior layer, the first-order diffracted signal intensity obtained from the one-dimensional linear pattern is smaller, that is, the alignment signal intensity is smaller, so that the OVL accuracy is lower, and the rework rate and production cost are higher.

In addition, in the process of performing CMP on a wafer, the alignment pattern 20 will be in contact with a polishing solution (a mixed solution of ultrafine particles, chemical oxidants and liquid media), and the alignment pattern 20 undergoes a chemical reaction with the polishing solution, resulting in a decrease in the thickness of the alignment pattern 20 (the size of the alignment pattern 20 in the normal direction of the surface of the wafer), where the larger the line width ml of the alignment pattern 20, the larger the area of contact between the alignment pattern 20 and the polishing solution, the more chemical reactions between the alignment pattern 20 and the polishing solution, and the more severe the thickness loss of the alignment pattern 20, resulting in a smaller thickness of the alignment pattern 20. In the photolithography process, the magnitude of the alignment signal intensity is directly proportional to the thickness of the alignment pattern 20. Due to the smaller thickness of the alignment pattern 20, the alignment signal intensity generated by the alignment mark 10 at the anterior layer is smaller, resulting in poor OVL accuracy of the anterior and posterior layers. Generally, there are various forms of overlay errors, including translation, rotation, expansion, and the like. If an overlay error exceeds the error tolerance, various problems may be caused. For example, the circuit produced may have an open circuit or a short circuit due to a displacement, thereby affecting the product yield.

FIG. 3 is an electron microscope cross-sectional view of a semiconductor structure obtained based on the alignment mark in FIG. 1.

Based on the measurement in FIG. 3, it can be seen that the target thickness of the original alignment pattern 20 is 360 Å, while the final thickness of the alignment pattern 20 is only 180 Å which is 50% lower than the target thickness. The signal intensity corresponding to the alignment mark 10 at the final thickness is only 0.5%, resulting in poor OVL accuracy of the anterior and posterior layers, thereby greatly increasing the photolithography rework caused by overlay offset, and leading to a low yield of the semiconductor structure.

In addition, in the prior art, a solution of breaking the one-dimensional linear pattern to increase the alignment signal intensity of the alignment mark 10 is further proposed. However, in the process of performing CMP on the wafer, the broken one-dimensional linear pattern still reacts with the polishing solution, resulting in a smaller thickness of the alignment pattern 20. Correspondingly, in the process of photolithography alignment according to the alignment mark 10 with the broken one-dimensional linear pattern, the alignment signal intensity is not increased, and there are still problems of lower OVL accuracy and higher rework rate and production cost.

To address the technical problems, implementations of the present disclosure provides an alignment mark, including: a plurality of alignment patterns arranged at intervals, where the alignment pattern includes a first pattern extending in a first direction and a second pattern extending in a second direction, the first pattern includes a first end and a second end which are opposite to each other in the first direction, the second pattern includes a third end and a fourth end which are opposite to each other in the second direction, the second end is connected to the third end, and the fourth end is connected to the first end.

The alignment mark provided in the present disclosure includes a plurality of alignment patterns arranged at intervals, where the alignment pattern includes a first pattern extending in a first direction and a second pattern extending in a second direction, the first pattern includes a first end and a second end which are opposite to each other in the first direction, the second pattern includes a third end and a fourth end which are opposite to each other in the second direction, the second end is connected to the third end, the fourth end is connected to the first end, and the alignment pattern is a two-dimensional linear pattern. Compared with the case in which the alignment mark is a one-dimensional linear pattern, in the process of alignment using the alignment mark provided in the present disclosure, the alignment mark forms periodically arranged Moire patterns on the macro level. The Moire patterns can enable an alignment system to obtain greater first-order diffracted signal intensity, and correspondingly, the alignment signal intensity is larger, so that the OVL accuracy is increased, and the rework rate and production cost are reduced.

In order to make the above objectives, features and advantages of the embodiments and the implementations of the present disclosure more apparent and understandable, specific embodiments and implementations of the present disclosure are described in detail below with reference to the accompanying drawings.

Figure 5:
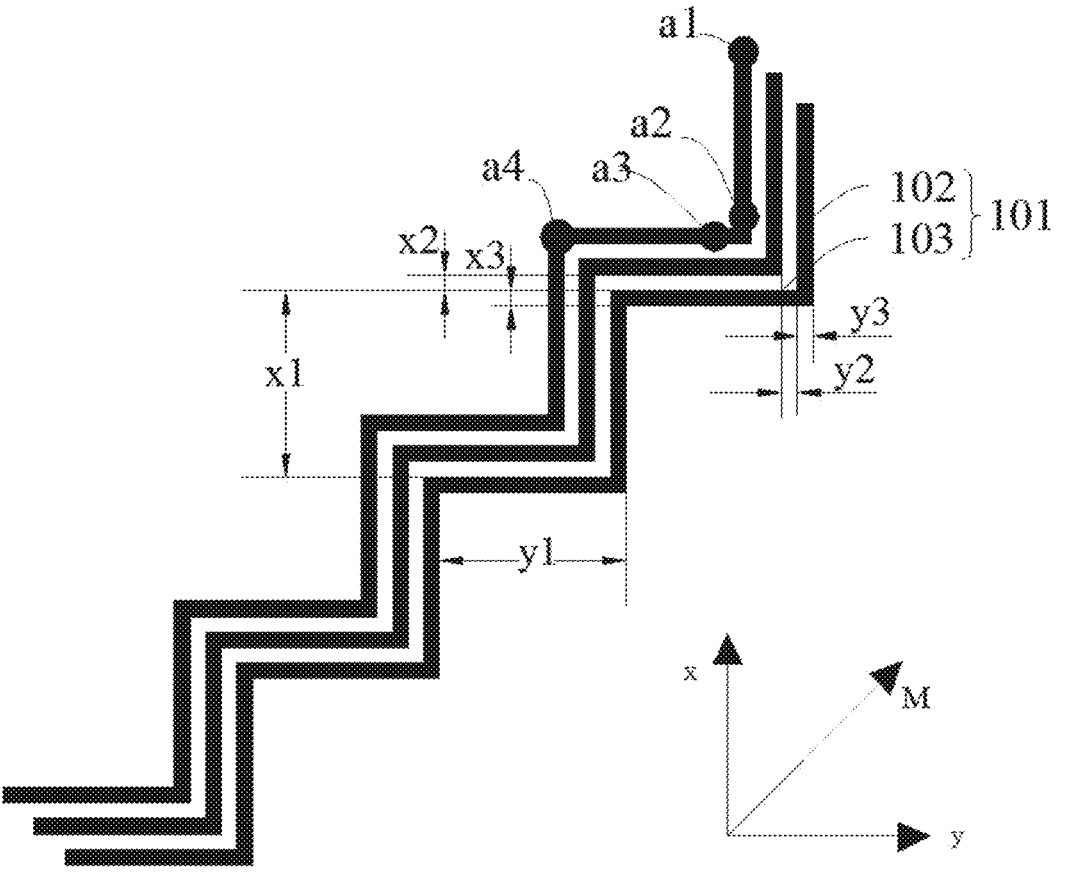
FIG. 5 is a partially enlarged view of FIG. 4.

Referring to FIG. 4 and FIG. 5, FIG. 4 is a schematic structural diagram of an alignment mask pattern on a mask plate according to an embodiment of the present disclosure, and FIG. 5 is a partially enlarged view of FIG. 4.

The mask plate includes: a device mask pattern for forming a device pattern and an alignment mask pattern 100 for forming an alignment mark, where the alignment mask pattern 100 includes two-dimensional linear patterns.

In embodiments and implementations of the present disclosure, the alignment mask pattern 100 includes two-dimensional linear patterns, and the alignment mark formed by the alignment mask pattern 100 of the mask plate provided in embodiments and implementations of the present disclosure subsequently is also a two-dimensional linear pattern. Compared with the case in which the alignment mark is a one-dimensional linear pattern, in the process of alignment using the alignment mark provided in the present disclosure, the alignment mark forms periodically arranged Moire patterns on the macro level. The Moire patterns can enable an alignment system to obtain greater first-order diffracted signal intensity, and correspondingly, the alignment signal intensity is larger, so that the OVL accuracy is increased, and the rework rate and production cost are reduced.

In some implementations, the mask plate further includes a device mask pattern. Correspondingly, the alignment mark and the device pattern can be formed simultaneously in one-step exposure according to the mask plate, so that a photomask can be saved, the production cost can be reduced, and the technological process can be simplified.

In some implementations, the alignment system includes an SMASH alignment system.

As shown in FIG. 5, the alignment mask pattern 100 includes: a plurality of combined patterns 101 arranged at intervals, where the combined pattern 101 includes a first mask sub-pattern 102 extending in a first direction (x) and a second mask sub-pattern 103 extending in a second direction (y), the first mask sub-pattern 102 includes a first end a1 and a second end a2 which are opposite to each other in the first direction, the second mask sub-pattern 103 includes a third end a3 and a fourth end a4 which are opposite to each other in the second direction, the second end a2 is connected to the third end a3, and the fourth end a4 is connected to the first end a1.

The first mask sub-pattern 102 extends in the first direction, and the second mask sub-pattern 103 extends in the second direction. The extension direction of the first mask sub-pattern 102 is different from the extension direction of the second mask sub-pattern 103, so that in the process of forming an alignment mark according to the alignment mask pattern 100, the formed alignment pattern includes a first pattern extending in the first direction and a second pattern extending in the second direction, the first pattern is formed based on the first mask sub-pattern 102, and the second pattern is formed based on the second mask sub-pattern 103. Compared with the case in which the alignment mask pattern is a one-dimensional linear pattern, the alignment mark formed in embodiments and implementations of the present disclosure is a two-dimensional linear pattern. Compared with the case in which the alignment mask pattern is a one-dimensional linear pattern and the formed alignment mark is a one-dimensional linear pattern, in the process of alignment using the alignment mark provided in the present disclosure, the alignment mark forms periodically arranged Moire patterns on the macro level. The Moire patterns can enable an alignment system to obtain greater first-order diffracted signal intensity, and correspondingly, the alignment signal intensity is larger, so that the OVL accuracy is increased, and the rework rate and production cost are reduced.

In some implementations, the first mask sub-pattern 102 includes a first end a1 and a second end a2 which are opposite to each other in the first direction, the second mask sub-pattern 103 includes a third end a3 and a fourth end a4 which are opposite to each other in the second direction, the second end a2 is connected to the third end a3, and the fourth end a4 is connected to the first end a1, so that the combined patterns 101 are patterns arranged in a stepped shape.

In some implementations, the first direction is perpendicular to the second direction. As a result, the first pattern formed based on the first mask sub-pattern 102 is perpendicular to the second pattern formed based on the second mask sub-pattern 103. In the process of alignment according to the alignment mark, the light emitted from an alignment light source is easily decomposed into the first direction and the second direction that are perpendicular to each other, and an alignment system is easy to obtain signals of first-order diffracted light in the first direction and the second direction simultaneously, so that the subsequent mask can be well positioned in the first direction and the second direction.

In some implementations, the size of the first mask sub-pattern 102 in the first direction is the same as the size of the second mask sub-pattern 103 in the second direction. As a result, the extension direction of the combined pattern 101 is the same as the extension direction of a bisector M of an included angle formed by the first direction and the second direction (shown in FIG. 5). Correspondingly, the size of the first pattern formed according to the first mask sub-pattern 102 in the first direction is the same as the size of the second pattern formed according to the second mask sub-pattern 103 in the second direction, and the macro extension direction of the alignment pattern formed according to the alignment mask pattern is the same as the extension direction of the bisector M of the included angle formed by the first direction and the second direction.

It should be noted that since the first direction is perpendicular to the second direction, the size x1 of the first mask sub-pattern 102 in the first direction (shown in FIG. 5) is the same as the size y1 of the second mask sub-pattern 103 in the second direction (shown in FIG. 5), and correspondingly, the included angle between the bisector M and the first direction and the second direction is 45°, in the process of alignment according to the alignment mark, it is beneficial to make the decomposition ratio of the light emitted from the alignment light source in the first direction the same as that in the second direction. As a result, the signal intensity of the first-order diffracted light in the first direction is easily the same as that in the second direction, so that the subsequent mask can be well positioned in the first direction and the second direction.

In some implementations, the interval x2 between the second mask sub-patterns 103 in the first direction (shown in FIG. 5) is equal to the interval y2 between the first mask sub-patterns 102 in the second direction (shown in FIG. 5). Accordingly, the interval formed between the second patterns in the first direction is equal to the interval formed between the first patterns in the second direction. In the subsequent process of alignment according to the alignment mark, it is easy to make the ratio of the diffracted light decomposed in the first direction according to the interval between the first patterns the same as that of the diffracted light decomposed in the second direction according to the interval between the second patterns. As a result, it is easy to make the signal intensity of the first-order diffracted light in the first direction the same as that in the second direction, so that the subsequent mask can be well positioned in the first direction and the second direction, thereby increasing the OVL accuracy, and reducing the rework rate and production cost.

It should be noted that the interval between the second mask sub-patterns 103 in the first direction is equal to the interval between the first mask sub-patterns 102 in the second direction, which can increase the uniformity of the intervals between the alignment patterns in all positions, and is easy to keep the cycles of the Moire patterns as consistent as possible. In the process of alignment, an alignment system can obtain greater first-order diffracted signal intensity, and correspondingly, the alignment signal intensity is larger, so that the OVL accuracy is increased, and the rework rate and production cost are reduced.

In some implementations, the size y3 of the first mask sub-pattern 102 in the second direction is the same as the size x3 of the second mask sub-pattern 103 in the first direction, which is beneficial to make the width of the first pattern formed subsequently according to the first mask sub-pattern 102 the same as the width of the second pattern formed according to the second mask sub-pattern 103. In the subsequent process of alignment according to the alignment mark, it is easy to make the ratio of the diffracted light decomposed in the first direction according to the first pattern the same as that of the diffracted light decomposed in the second direction according to the second pattern. As a result, it is easy to make the signal intensity of the first-order diffracted light in the first direction the same as that in the second direction, so that the subsequent mask can be well positioned in the first direction and the second direction, thereby increasing the OVL accuracy, and reducing the rework rate and production cost.

It should be noted that the size of the first mask sub-pattern 102 in the second direction is the same as the size of the second mask sub-pattern 103 in the first direction, which is beneficial to increase the uniformity of the widths of the alignment patterns 200 in all positions, and is easy to keep the cycles of the Moire patterns as consistent as possible. In the process of alignment, an alignment system can obtain greater first-order diffracted signal intensity, and correspondingly, the alignment signal intensity is larger, so that the OVL accuracy is increased, and the rework rate and production cost are reduced.

Figure 6:
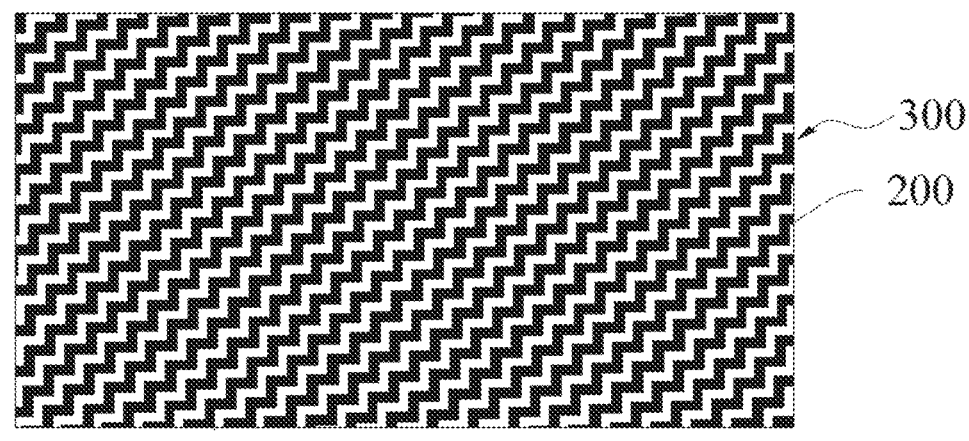
FIG. 6 is a schematic structural diagram of an alignment mark.
Figure 7:
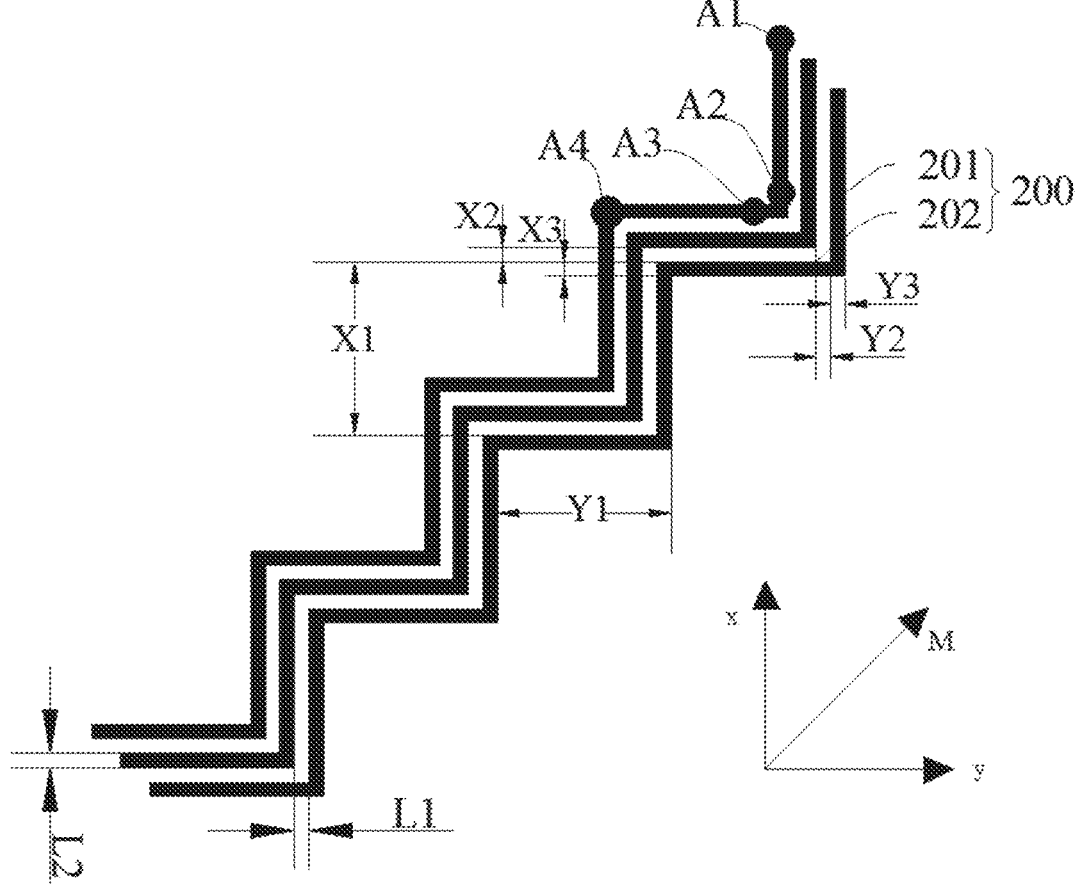
FIG. 7 is a partially enlarged view of FIG. 6.

Referring to FIG. 6 and FIG. 7, FIG. 6 is a schematic structural diagram of an alignment mark 300 according to an embodiment of the present disclosure, and FIG. 7 is a partially enlarged view of FIG. 6.

The alignment mark 300 includes: a plurality of alignment patterns 200 arranged at intervals, where the alignment pattern 200 includes a first pattern 201 extending in a first direction (x) and a second pattern 202 extending in a second direction (y), the first pattern 201 and the second pattern 202 are alternately connected in sequence, the first pattern 201 includes a first end A1 and a second end A2 which are opposite to each other in the first direction, the second pattern 202 includes a third end A3 and a fourth end A4 which are opposite to each other in the second direction, the second end A2 is connected to the third end A3, and the fourth end A4 is connected to the first end A1.

The alignment mark provided in the embodiments of the present disclosure includes a plurality of alignment patterns 200 arranged at intervals, where the alignment pattern 200 includes a first pattern 201 extending in a first direction and a second pattern 202 extending in a second direction, the first pattern 201 includes a first end and a second end which are opposite to each other in the first direction, the second pattern 202 includes a third end and a fourth end which are opposite to each other in the second direction, the second end is connected to the third end, the fourth end is connected to the first end, and the alignment pattern 200 is a two-dimensional linear pattern. Compared with the case in which the alignment mark is a one-dimensional linear pattern, in the process of alignment using the alignment mark provided in embodiments and implementations of the present disclosure, the alignment mark forms periodically arranged Moire patterns on the macro level. The Moire patterns can enable an alignment system to obtain greater first-order diffracted signal intensity, and correspondingly, the alignment signal intensity is larger, so that the OVL accuracy is increased, and the rework rate and production cost are reduced.

In some implementations, the alignment system includes an SMASH alignment system.

As shown in FIG. 7, in some implementations, the first pattern 201 includes a first end A1 and a second end A2 which are opposite to each other in the first direction, the second pattern 202 includes a third end A3 and a fourth end A4 which are opposite to each other in the second direction, the second end A2 is connected to the third end A3, and the fourth end A4 is connected to the first end A1, so that the alignment patterns 200 are patterns arranged in a stepped shape.

In some implementations, the first direction is perpendicular to the second direction. In the process of alignment according to the alignment mark, the light emitted from an alignment light source is easily decomposed into the first direction and the second direction that are perpendicular to each other, and an alignment system is easy to obtain signals of first-order diffracted light in the first direction and the second direction simultaneously, so that the subsequent mask can be well positioned in the first direction and the second direction.

In some implementations, the size X1 of the first pattern 201 in the first direction (shown in FIG. 7) is the same as the size Y1 of the second pattern 202 in the second direction (shown in FIG. 7). As a result, the extension direction of the alignment pattern 200 is the same as the extension direction of a bisector M of an included angle formed by the first direction and the second direction (shown in FIG. 7), and then, the macro extension direction of the alignment pattern is the same as the extension direction of the bisector M of the included angle formed by the first direction and the second direction.

It should be noted that since the first direction is perpendicular to the second direction, the size of the first pattern 201 in the first direction is the same as the size of the second pattern 202 in the second direction, and correspondingly, the included angle between the bisector M and the first direction and the second direction is 45°, in the process of alignment according to the alignment mark, it is beneficial to make the decomposition ratio of the light emitted from the alignment light source in the first direction the same as that in the second direction. As a result, the signal intensity of the first-order diffracted light in the first direction is easily the same as that in the second direction, so that the subsequent mask can be well positioned in the first direction and the second direction.

In some implementations, the interval X2 between the second patterns 202 in the first direction (shown in FIG. 7) is equal to the interval Y2 between the first patterns 201 in the second direction (shown in FIG. 7). In the subsequent process of alignment according to the alignment mark, it is easy to make the ratio of the diffracted light decomposed in the first direction according to the interval between the first patterns 201 the same as that of the diffracted light decomposed in the second direction according to the interval between the second patterns 202. As a result, it is easy to make the signal intensity of the first-order diffracted light in the first direction the same as that in the second direction, so that the subsequent mask can be well positioned in the first direction and the second direction, thereby increasing the OVL accuracy, and reducing the rework rate and production cost.

It should be noted that the interval X2 between the second patterns 202 in the first direction is equal to the interval Y2 between the first patterns 201 in the second direction, which can increase the uniformity of the intervals between the alignment patterns in all positions, and is easy to keep the cycles of the Moire patterns as consistent as possible. In the process of alignment, an alignment system can obtain greater first-order diffracted signal intensity, and correspondingly, the alignment signal intensity is larger, so that the OVL accuracy is increased, and the rework rate and production cost are reduced.

In some implementations, the size Y3 of the first pattern 201 in the second direction (shown in FIG. 7) is the same as the size X3 of the second pattern 202 in the first direction (shown in FIG. 7). In the subsequent process of alignment according to the alignment mark, it is easy to make the ratio of the diffracted light decomposed in the first direction according to the first pattern the same as that of the diffracted light decomposed in the second direction according to the second pattern. As a result, it is easy to make the signal intensity of the first-order diffracted light in the first direction the same as that in the second direction, so that the subsequent mask can be well positioned in the first direction and the second direction, thereby increasing the OVL accuracy, and reducing the rework rate and production cost.

It should be noted that the size of the first pattern 201 in the second direction should not be too large or too small. If the size is too large, in the process of performing CMP on a wafer, the area of chemical reaction between the alignment pattern 200 and a polishing solution is larger, so that the thickness of the alignment pattern 200 (the size of the alignment pattern in a normal direction of the surface of the wafer) is easy to reduce. As a result, the alignment signal intensity generated by the alignment mark 300 is smaller, the OVL accuracy is poor, and the rework rate and production cost are higher. If the size is too small, it is easy to increase the difficulty in forming the alignment mark 300, which is not beneficial to save the process cost of a semiconductor structure.

In some implementations, the size of the first pattern 201 in the second direction is 50 nm to 300 nm, and correspondingly, the size of the second pattern 202 in the first direction is 50 nm to 300 nm. Compared with the case in which the size of the first pattern 201 in the second direction is a micron level and the size of the second pattern 202 in the first direction is a micron level, the width of the first pattern 201 and the width of the second pattern 202 are smaller. Correspondingly, in the process of performing CMP on the wafer, the area of chemical reaction between the alignment pattern 200 and the polishing solution is smaller, so that the thickness of the alignment pattern 200 (the size of the alignment pattern in the normal direction of the surface of the wafer) is not easy to reduce. In the photolithography process, the magnitude of the alignment signal intensity is directly proportional to the thickness of the alignment pattern 200, as a result, if the thickness of the alignment pattern 200 is larger, correspondingly, the alignment signal intensity generated by the alignment mark 300 is larger, so that the OVL accuracy is higher, and the rework rate and production cost are reduced.

It should be noted that the size of the first pattern 201 in the second direction is the same as the size of the second pattern 202 in the first direction, that is, the width of the first pattern 201 is the same as the width of the second pattern 202, which is beneficial to increase the uniformity of the widths of the alignment patterns 200 in all positions, and is easy to keep the cycles of the Moire patterns as consistent as possible. In the process of alignment, an alignment system can obtain greater first-order diffracted signal intensity, and correspondingly, the alignment signal intensity is larger, so that the OVL accuracy is increased, and the rework rate and production cost are reduced.

It should be noted that in the alignment mark 300, parameters such as the interval between the first patterns 201 in the second direction, the interval between the second patterns 202 in the first direction, the size of the first pattern 201 in the second direction, the size of the second pattern 202 in the first direction, the size of the first pattern in the first direction, and the size of the second pattern in the second direction can be adjusted according to the actual photolithography lighting process capability.

The present disclosure further provides a photolithography system that uses the above-described mask plate to form an alignment mark.

The alignment mark formed using the above-described mask plate is a two-dimensional linear pattern. Compared with the case in which the alignment mark is a one-dimensional linear pattern, in the process of alignment using the alignment mark provided in embodiments and implementations of the present disclosure, the alignment mark forms periodically arranged Moire patterns on the macro level, the Moire patterns can enable an alignment system to obtain greater first-order diffracted signal intensity, and correspondingly, the alignment signal intensity is larger, so that the OVL accuracy is increased, and the rework rate and production cost are reduced.

In the step of forming the alignment mark, the alignment mark is formed in a cutting path on the wafer. The cutting path is subsequently used for cutting, and the alignment mark is formed in the cutting path on the wafer, which cannot affect the formation of a device, and can increase the area utilization ratio of the wafer.

Implementations of a method for forming the semiconductor structure include: after an alignment mark is formed on the wafer, the wafer is subjected to CMP, and the wafer after CMP at least has the alignment mark. Since the wafer at least has the alignment mark, in the subsequent photolithography alignment process, photolithography alignment can be performed according to the alignment mark.

It should be noted that before CMP, the top surface of the alignment mark can be higher than or lower than the top surface of the layer to be polished; and during CMP, the alignment mark can be thinned to a certain extent to enable the top surface of the alignment mark to be flush with the top surface of the layer to be polished.

Figure 8:
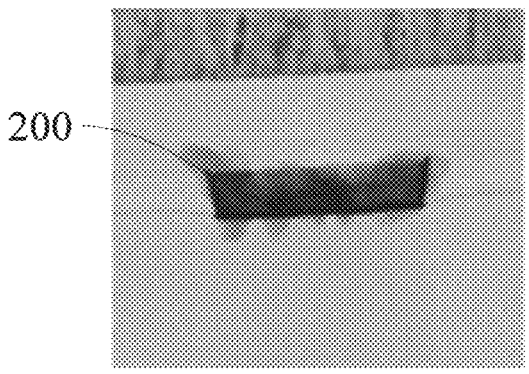
FIG. 8 is an electron microscope cross-sectional view of a semiconductor structure obtained based on an alignment mark.

FIG. 8 is an electron microscope cross-sectional view of a semiconductor structure obtained based on an alignment mark according to implementations of the present disclosure. It can be seen from the figure that the thickness of the alignment pattern 200 is increased. In the photolithography process, the magnitude of the alignment signal intensity is directly proportional to the thickness of the alignment pattern 200, as a result, if the thickness of the alignment pattern 200 is larger, correspondingly, the alignment signal intensity generated by the alignment mark is larger, so that the OVL accuracy is higher, and the rework rate and production cost are reduced.

Although embodiments and implementations of the present disclosure are disclosed as above, the present disclosure is not limited to these embodiments and implementations. Any person skilled in the art can make various changes and modifications without departing from the spirit and scope of embodiments and implementations of the present disclosure. Therefore, the protection scope of the present disclosure shall be subject to the scope defined in the claims.

What is claimed is:

1. A mask plate, comprising:
a device mask pattern configured for forming a device pattern; and
an alignment mask pattern configured for forming an alignment mark, wherein the alignment mask pattern comprises a plurality of combined patterns arranged at intervals, wherein the combined pattern comprises a first mask sub-pattern extending in a first direction and a second mask sub-pattern extending in a second direction, a size of the first mask sub-pattern in the second direction is 50 nm to 300 nm and is the same as a size of the second mask sub-pattern in the first direction.

2. The mask plate according to claim 1,
wherein the first mask sub-pattern and the second mask sub-pattern are alternately connected in sequence; and
wherein the first mask sub-pattern comprises a first end and a second end which are opposite to each other in the first direction, the second mask sub-pattern comprises a third end and a fourth end which are opposite to each other in the second direction, the second end is connected to the third end, and the fourth end is connected to the first end.

3. The mask plate according to claim 2, wherein the first direction is perpendicular to the second direction.

4. The mask plate according to claim 2, wherein a size of the first mask sub-pattern in the first direction is the same as a size of the second mask sub-pattern in the second direction.

5. The mask plate according to claim 4, wherein an interval between the second mask sub-patterns in the first direction is equal to an interval between the first mask sub-patterns in the second direction.

6. A photolithography system, using the mask plate according to claim 1 to form an alignment mark.

7. An alignment mark, comprising:
a plurality of alignment patterns arranged at intervals, wherein the alignment pattern comprises a first pattern extending in a first direction and a second pattern extending in a second direction, wherein a size of the first pattern in the second direction is 50 nm to 300 nm and is the same as a size of the second pattern in the first direction;
wherein the first pattern and the second pattern are alternately connected in sequence; and
wherein the first pattern comprises a first end and a second end which are opposite to each other in the first direction, the second pattern comprises a third end and a fourth end which are opposite to each other in the second direction, the second end is connected to the third end, and the fourth end is connected to the first end.

8. The alignment mark according to claim 7, wherein the first direction is perpendicular to the second direction.

9. The alignment mark according to claim 7, wherein a size of the first pattern in the first direction is the same as a size of the second pattern in the second direction.

10. The alignment mark according to claim 9, wherein an interval between the second patterns in the first direction is equal to an interval between the first patterns in the second direction.

* * * * *